United States Patent
Cheng et al.

(10) Patent No.: US 10,153,157 B2
(45) Date of Patent: Dec. 11, 2018

(54) P-FET WITH GRADED SILICON-GERMANIUM CHANNEL

(71) Applicant: International Business Machines Corporation, Armonk, NY (US)

(72) Inventors: Kangguo Cheng, Schenectady, NY (US); Ali Khakifirooz, Los Altos, CA (US); Darsen D. Lu, Taichung (TW); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/835,832

(22) Filed: Aug. 26, 2015

(65) Prior Publication Data
US 2015/0364555 A1    Dec. 17, 2015

Related U.S. Application Data

(62) Division of application No. 14/221,339, filed on Mar. 21, 2014, now abandoned.

(51) Int. Cl.
*H01L 27/12* (2006.01)
*H01L 21/02* (2006.01)
(Continued)

(52) U.S. Cl.
CPC ...... *H01L 21/0251* (2013.01); *H01L 21/0245* (2013.01); *H01L 21/0262* (2013.01); *H01L 21/02532* (2013.01); *H01L 21/02612* (2013.01); *H01L 21/02634* (2013.01); *H01L 21/02664* (2013.01); *H01L 21/2251* (2013.01); *H01L 21/30604* (2013.01); *H01L 21/7624* (2013.01);
(Continued)

(58) Field of Classification Search
None
See application file for complete search history.

(56) References Cited

U.S. PATENT DOCUMENTS

| 5,821,577 A | 10/1998 | Crabbé et al. |
| 6,004,137 A | 12/1999 | Crabbé et al. |

(Continued)

OTHER PUBLICATIONS

Ouyang et al., "Built-in Longitudinal Field Effects in Sub-100-nm Graded $Si_{1-x}Ge_x$ Channel PMOSFETs", IEEE Transactions on Electron Devices, vol. 48, No. 6, Jun. 2001, pp. 1245-1250.
(Continued)

*Primary Examiner* — Daniel Whalen
(74) *Attorney, Agent, or Firm* — Michael O'Keefe (57) ABSTRACT

A method of forming a semiconductor structure includes forming a silicon-germanium layer on a semiconductor region of a substrate having a specific concentration of germanium atoms. The semiconductor region and the silicon-germanium layer are annealed to induce a non-homogenous thermal diffusion of germanium atoms from the silicon-germanium layer into the semiconductor region to form a graded silicon-germanium region. Another method of forming a semiconductor structure includes etching a semiconductor region of the substrate to form a thinned semiconductor region. A silicon-germanium layer is formed on the thinned semiconductor region having a graded germanium concentration profile.

7 Claims, 8 Drawing Sheets

(51) Int. Cl.
  *H01L 29/161* (2006.01)
  *H01L 21/306* (2006.01)
  *H01L 21/225* (2006.01)
  *H01L 29/10* (2006.01)
  *H01L 29/165* (2006.01)
  *H01L 29/16* (2006.01)
  *H01L 29/36* (2006.01)
  *H01L 21/762* (2006.01)
  *H01L 29/66* (2006.01)
  *H01L 29/786* (2006.01)

(52) U.S. Cl.
  CPC ...... *H01L 27/1211* (2013.01); *H01L 29/1054* (2013.01); *H01L 29/16* (2013.01); *H01L 29/161* (2013.01); *H01L 29/165* (2013.01); *H01L 29/36* (2013.01); *H01L 29/66742* (2013.01); *H01L 29/66795* (2013.01); *H01L 29/78684* (2013.01); *H01L 29/78696* (2013.01)

(56) References Cited

U.S. PATENT DOCUMENTS

| | | |
|---|---|---|
| 6,515,335 B1 | 2/2003 | Christiansen et al. |
| 2003/0146473 A1 | 8/2003 | Inoue et al. |
| 2006/0292762 A1 | 12/2006 | Borland et al. |
| 2007/0045611 A1 | 3/2007 | Zhu et al. |
| 2009/0014794 A1 | 1/2009 | Zhu et al. |
| 2011/0147811 A1* | 6/2011 | Kavalieros ........ H01L 29/66795 257/288 |
| 2011/0227165 A1* | 9/2011 | Basker ................ H01L 21/845 257/369 |
| 2012/0199814 A1 | 8/2012 | Berger |
| 2012/0326268 A1 | 12/2012 | Kato et al. |
| 2013/0052801 A1* | 2/2013 | Berliner ............. H01L 21/845 438/468 |
| 2013/0099318 A1 | 4/2013 | Adam et al. |
| 2014/0175543 A1* | 6/2014 | Glass ............ H01L 21/823431 257/337 |
| 2015/0097217 A1* | 4/2015 | Cheng ................. H01L 29/785 257/288 |
| 2015/0102412 A1* | 4/2015 | Morin ................. H01L 27/092 257/351 |
| 2015/0228755 A1 | 8/2015 | Wei et al. |
| 2015/0270344 A1 | 9/2015 | Cheng et al. |
| 2016/0064210 A1 | 3/2016 | Cheng et al. |

OTHER PUBLICATIONS

Goyal et al., "Graded Silicon-Germanium Channel Tunnel Field Effect Transistor (G-TFET), An Approach to Increase ION without compromising IOFF", ISDRS 2011, Dec. 7-9, 2011.

Verdonckt-Vanderbroek et al., "SiGe-Channel Heterojunction p-MOSFET's", IEEE Transactions on Electron Devices, vol. 41, No. 1, Jan. 1994, pp. 90-101.

Pending U.S. Appl. No. 14/221,339, filed Mar. 21, 2014, entitled: "P-FET With Graded Silicon-Germanium Channel", pp. 1-29.

\* cited by examiner

P-FET WITH GRADED SILICON-GERMANIUM CHANNEL

CROSS-REFERENCE TO RELATED APPLICATIONS

The present application is a divisional of and claims the benefit of priority of U.S. patent application Ser. No. 14/221,339, filed on Mar. 21, 2014 with the U.S. Patent and Trademark Office (USPTO), the contents of which are herein incorporated by reference in its entirety.

BACKGROUND

The present invention generally relates to semiconductor structures, and more particularly to p-type field effect transistor (p-FET) devices having a graded silicon-germanium channel region, and a method for making the same.

Complementary metal-oxide-semiconductor (CMOS) technology is commonly used for fabricating field effect transistors (FETs) as part of advanced integrated circuits (IC), such as CPUs, memory, storage devices, and the like. Depending whether the on-state current is carried by electrons or holes, the FET comes as an n-FET device or a p-FET device. The overall fabrication process may include forming a gate structure over a channel region connecting source-drain regions within a semiconductor substrate on opposite sides of the gate, typically with some vertical overlap between the gate and the source-drain region.

An alternative for continued scaling of planar FETs to the 22 nm node and beyond may include the formation of CMOS devices on extremely thin semiconductor-on-insulator (ETSOI) substrates. ETSOI FETs are fully depleted metal-oxide semiconductor field effect transistor (MOSFET) devices having a thin channel region. Currently, fin field effect transistors (FinFETs) are becoming more widely used, primarily because they may offer better performance than planar FETs at the same power budget.

FinFETs are three dimensional (3-D), fully depleted MOSFET devices having a fin structure formed from the semiconductor substrate material. The fins may extend between the device source and drain surrounding a channel region forming the bulk of the semiconductor device. The gate structure may be located over the fins covering the channel region. FinFETs architecture may allow for a more precise control of the conducting channel by the gate, significantly reducing the amount of current leakage when the device is in off state.

Fully depleted MOSFETs having a silicon-germanium (SiGe) channel region may be considered an effective way to improve device performance. However, SiGe channel MOSFETs including FinFETs and ETSOI FETs, usually exhibit higher current leakage. Current leakage in SiGe channel MOSFETs may be attributed to the fact that devices including a silicon-germanium channel region may have a smaller band gap than devices including a silicon channel region.

SUMMARY

The ability to manufacture semiconductor devices including a graded silicon-germanium (SiGe) channel may facilitate advancing the capabilities of current fully depleted metal-oxide semiconductor field effect transistor (MOSFET) technology.

According to an embodiment of the present disclosure, a method of forming a semiconductor structure includes: forming a silicon-germanium layer on a semiconductor region of a substrate. The silicon-germanium layer has a specific concentration of germanium atoms. The semiconductor region and the silicon-germanium layer are annealed to induce a non-homogenous thermal diffusion of germanium atoms from the silicon-germanium layer into the semiconductor region to form a graded silicon-germanium region.

According to another embodiment of the present disclosure, a method of forming a semiconductor structure includes: etching a semiconductor region of a substrate to form a thinned semiconductor region. A silicon-germanium layer is formed on the thinned semiconductor region. The silicon-germanium layer has a graded germanium concentration profile.

According to another embodiment of the present disclosure, a semiconductor structure includes: a graded silicon-germanium semiconductor region on a semiconductor substrate. The graded silicon-germanium region includes a concentration of germanium atoms increasing towards a gate structure formed above a portion of the graded silicon-germanium region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This invention may, however, be modified in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

A method of forming a semiconductor structure including a silicon-germanium (SiGe) channel region with a graded concentration of germanium atoms (hereinafter "graded SiGe channel") is described in detail below by referring to the accompanying drawings in FIGS. 1-14, in accordance with an illustrative embodiment of the present disclosure. The method may provide a semiconductor structure having a SiGe channel region with a germanium (Ge) concentration gradient that may suit p-FETs workfunction and in turn enhance current leakage control and improve device performance without altering the dimensions of the channel region.

One way to fabricate a graded SiGe channel may include diffusing germanium atoms into a silicon (Si) channel region from a SiGe layer. One embodiment by which to fabricate the graded SiGe channel is described in detail below by referring to the accompanying drawings in FIGS. 1-5. More specifically, the present embodiment will focus on the fabrication of a p-type FinFET device.

It should be noted that commonly in CMOS technology a p-FET device may be formed in a p-FET region of the semiconductor substrate simultaneously with an n-FET device in an n-FET region of the same semiconductor substrate, and that both p-FET and n-FET devices may be used together in an integrated circuit. The p-FET and n-FET combination may find applications in analog or digital circuits. Typically, p-FET and n-FET devices may be separated from one another both physically and electrically by isolation regions. In the figures, only the p-FET region of the SOI substrate will be shown. It may be understood by a person skilled in the art that the n-FET region of the SOI substrate may be covered by a hardmask layer during formation of the graded SiGe channel. The steps involved in masking the n-FET region are conventional and well known to those skilled in the art.

Figure 1:
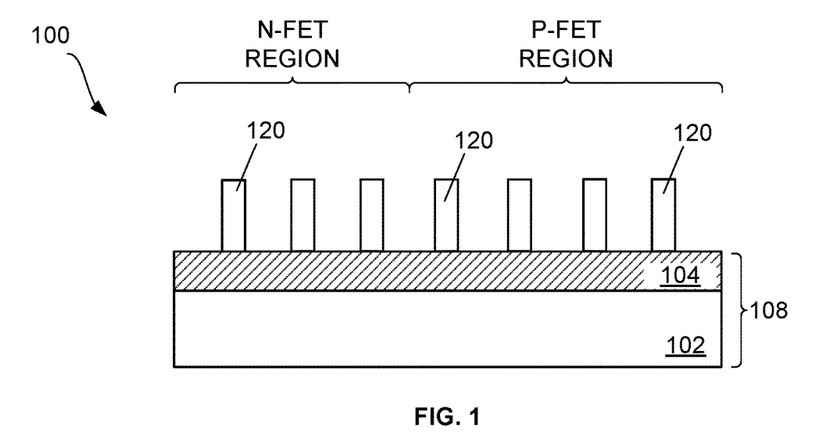
FIG. 1 is a cross-sectional view of a semiconductor structure depicting a plurality of silicon fins formed from a SOI substrate, according to an embodiment of the present disclosure.

Referring now to FIG. 1, a semiconductor structure 100 including a semiconductor-on-insulator (SOI) substrate 108 is shown. At this point of the fabrication process, a plurality of silicon fins 120 have been patterned and formed on the SOI substrate 108. It may be understood that the silicon fins 120 may be formed in any semiconductor substrate know to a person having ordinary skill in the art, including but not limited to SOI substrates and bulk silicon substrates. Also, it may be understood that while this description refers to some components of the semiconductor structure 100 in the singular tense, more than one component may be depicted throughout the figures and like components are labeled with like numerals.

The SOI substrate 108 employed in the present embodiment may include a base substrate 102, a buried dielectric layer 104 formed on top of the base substrate 102, and a SOI layer (not shown) formed on top of the buried dielectric layer 104. The buried dielectric layer 104 isolates the SOI layer from the base substrate 102. The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102 may be about, but is not limited to, several hundred microns thick. For example, the base substrate 102 may include a thickness ranging from approximately 0.5 mm to approximately 1.5 mm.

The buried dielectric layer 104 may be formed from any of several known dielectric materials. Non-limiting examples include, for example, oxides, nitrides and oxynitrides of silicon. Oxides, nitrides and oxynitrides of other elements are also envisioned. In addition, the buried dielectric layer 104 may include crystalline or non-crystalline dielectric material. Moreover, the buried dielectric layer 104 may be formed using any of several known methods. Non-limiting examples include ion implantation methods, thermal or plasma oxidation or nitridation methods, chemical vapor deposition methods and physical vapor deposition methods. The buried dielectric layer 104 may include a thickness ranging from approximately 10 nm to approximately 500 nm. In one embodiment, the buried dielectric layer 104 may be approximately 145 nm thick.

The SOI layer (not shown) and the base substrate 102 may have the same or different crystal orientation. For example, the crystal orientation of the base substrate 102 and/or the SOI layer (not shown) may be {100}, {110}, or {111}. Other crystallographic orientations besides those specifically mentioned may also be used in the present application. The base substrate 102 and/or the SOI layer (not shown) may be a single crystalline semiconductor material, a polycrystalline material, or an amorphous material. Typically, at least the SOI layer may be a single crystalline semiconductor material. In some embodiments, the SOI layer (not shown) may be processed to include semiconductor regions having different crystal orientations. Methods for forming the SOI layer are well known in the art. Non-limiting examples include SIMOX (Separation by Implantation of Oxygen), wafer bonding, and ELTRAN® (Epitaxial Layer TRANsfer). The SOI layer may include a thickness ranging from about 5 nm to about 100 nm that may be entirely consumed during patterning of the silicon fins 120 as described in detail below.

With continued reference to FIG. 1, the silicon fins 120 may be formed from the SOI layer (not shown) of the SOI substrate 108. More specifically, the silicon fins 120 may be etched from the SOI layer (not shown) using typical photolithography techniques, such as for example: sidewall image transfer (SIT). The SOI layer may be entirely consumed during the process of forming the silicon fins 120. In one embodiment, the silicon fins 120 may have a height of about 4 nm to about 60 nm, and a width of about 2 nm to about 20 nm. It should be noted that any number of silicon fins applicable for a specific FinFET design may be manufactured.

Figure 2:
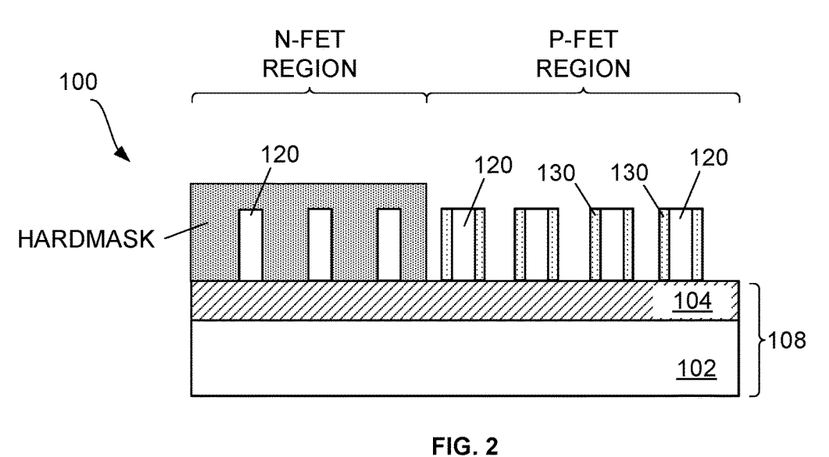
FIG. 2 is a cross-sectional view of a semiconductor structure depicting the formation of a silicon-germanium layer on sidewalls of the silicon fins, according to an embodiment of the present disclosure.

Referring now to FIG. 2, a SiGe layer 130 may be formed on sidewalls of the silicon fins 120. The SiGe layer 130 may be formed utilizing any epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it is formed. For example, an epitaxial semiconductor material deposited on a {100} crystal surface will take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Examples of various epitaxial growth process apparatuses that are suitable for use in forming the SiGe layer 130 may include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the SiGe layer 130 typically ranges from about 550° C. to about 900° C. Although higher temperature typically results in faster deposition, the faster deposition may result in crystal defects and film cracking.

A number of different source gases may be used for the deposition of the SiGe layer 130. In one embodiment, a combination of a silicon source gas and a germanium source gas may be used in forming the layer of silicon germanium alloy. Examples of silicon source gases that may be used include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium source gases that may be used include germane, digermane, halogermane, dichlorogermane, trichlorogermane, tetrachlorogermane, and combinations thereof. In some embodiments, a single source gas that includes a silicon component and a germanium component may be used in forming the SiGe layer 130. Carrier gases like hydrogen, nitrogen, helium, and argon may be used during the epitaxial growth process.

Alternatively, a hardmask layer (not shown) may be positioned atop the silicon fins 120 before forming the SiGe layer 130 to prevent the formation of silicon-germanium on a top surface of the silicon fins 120. The process of placing a protective hardmask layer on the top surface of the silicon fins 120 is well-known to those skilled in the art and may include forming a protective cap of a dielectric material (not shown).

In one embodiment of the present disclosure, the SiGe layer 130 may include an elevated concentration of germanium atoms. The atomic concentration of Ge in the SiGe layer 130 may range from about 30% to about 80%. In another embodiment, the concentration of Ge may range from about 40% to about 60%. The SiGe layer 130 may have a uniform thickness ranging from about 5 nm to about 20 nm and ranges there between, although a thickness less than 5 nm and greater than 20 nm may be acceptable. In one particular embodiment, the SiGe layer 130 may have a thickness of approximately 10 nm.

Figure 3:
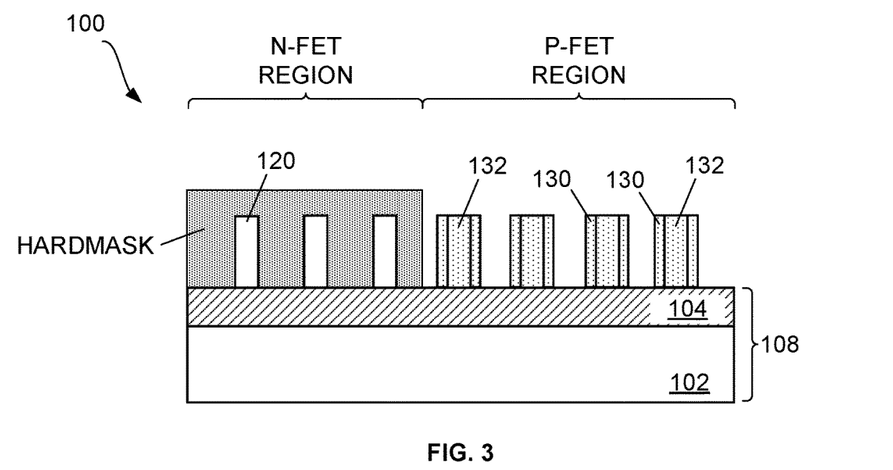
FIG. 3 is a cross-sectional view of a semiconductor structure depicting the formation of graded silicon-germanium fins, according to an embodiment of the present disclosure.

Referring now to FIG. 3, the semiconductor structure 100 may be subjected to a thermal annealing treatment to cause diffusion of germanium atoms from the SiGe layer 130 into the silicon fins 120 and form graded SiGe fins 132. The thermal diffusion process may be performed at a temperature high enough to cause diffusion of germanium atoms out of the SiGe layer 130 and into the silicon fins 120. The thermal diffusion of germanium atoms may take place under controlled conditions of temperature and time in order to avoid homogenization of germanium atoms in the silicon fins 120. In one embodiment, for example, the thermal diffusion process may be performed at a temperature varying from about 800° C. to about 1150° C., for about 1 min to about 30 minutes. The thermal difffusion process may be carried out at a single targeted temperature, or various ramp and soak cycles using various ramp rates and soak times may be employed.

In general, the initial concentration of germanium atoms in the SiGe layer 130, the annealing temperature and time may determine the percentage of germanium atoms and the germanium concentration gradient in the graded SiGe fins 132. For example, a SiGe layer 130 with a germanium concentration of 80% subjected to an annealing temperature of 1100° C. during approximately 30 min may drive numerous germanium atoms to the silicon fins 120 (FIG. 2) resulting in the graded SiGe fins 132 having a steep germanium concentration gradient with a substantially high germanium concentration even at the end of the diffusion process. A similar behavior may be observed with an initial germanium concentration of approximately 40% in the SiGe layer 130; however the final germanium concentration in the graded SiGe fins 132 may be less with a lower germanium concentration gradient. Conversely, if the thermal annealing treatment is conducted for a shorter period of time, the germanium profile obtained in the graded SiGe fins 132 may exhibit a high germanium concentration on the outside of the graded SiGe fins 132 that may drop quickly towards the inner part of the graded SiGe fins 132.

The controlled inter-diffusion of silicon and germanium atoms between the SiGe layer 130 and the silicon fin 120 may cause a gradient concentration profile of germanium atoms in a direction perpendicular to the current flow. Stated differently, current generally flows along a length of the graded SiGe fins 132, and the gradation of germanium concentration extends from an interface between the graded SiGe fins 132 and a subsequently formed gate structure in a direction perpendicular to the direction of the current. The elevated germanium concentration in the SiGe layer 130 and the temperature and time conditions during the thermal treatment may enable a rapid diffusion of germanium atoms into the silicon fins 120 (FIG. 2), favoring the formation of the graded SiGe fins 132. Inter-diffusion may occur when germanium atoms, activated by the high temperature, migrate from a region containing a high germanium concentration (such as the SiGe layer 130) to a region of low (or zero) concentration of germanium atoms (such as the silicon fins 120 shown in FIG. 2).

In one embodiment, the atomic concentration of germanium in the graded SiGe fins 132 after the thermal diffusion may range from about 25% to about 45%. At this step of the fabrication process, the atomic concentration of germanium in the SiGe layer 130 may have decreased after the thermal diffusion process, however it may still be high enough to allow for the selective removal of the SiGe layer 130 with respect to the graded SiGe fins 132.

Figure 4:
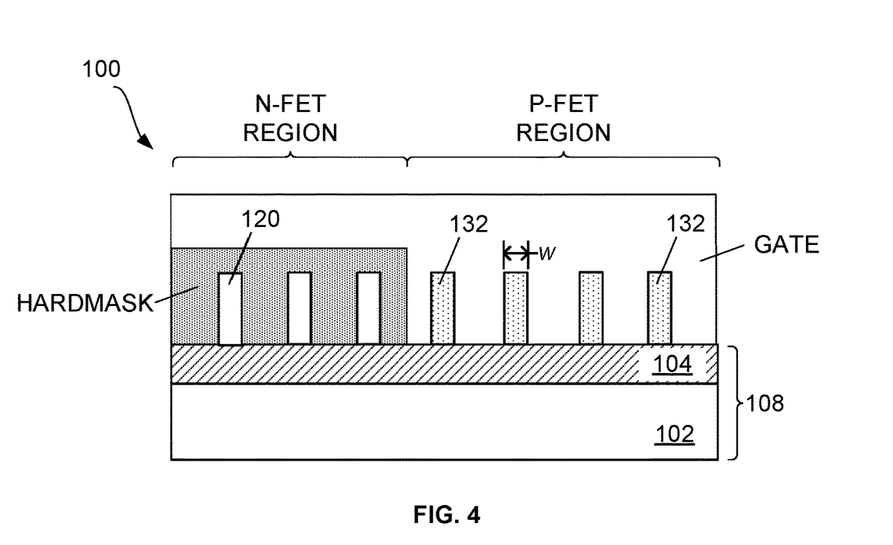
FIG. 4 is a cross-sectional view of a semiconductor structure depicting the removal of the silicon-germanium layer from the graded silicon-germanium fins, according to an embodiment of the present disclosure.

Referring now to FIG. 4, the SiGe layer 130 may be removed from the graded SiGe fins 132 in order to keep the dimensions of the graded SiGe fins 132 similar to the initial dimensions of the silicon fins 120 described above in conjunction with FIG. 1. Owing to the still elevated concentration of germanium atoms within the SiGe layer 130, it may be selectively removed from the graded SiGe fins 132 by means of any suitable etching technique known in the art, such as for example: gaseous HCl etch or wet etch with tetramethylammonium hydroxide (TMAH). In one embodiment, the HCl gas etch may be conducted in the epitaxial reactor. In one embodiment the deposition of the SiGe layer 130, the thermal treatment, and removal of the SiGe layer 130 may be performed in the same epitaxy reactor without taking the wafer out of the reactor.

The graded SiGe fins 132 may have substantially similar width and height than the silicon fins 120 (FIG. 1) so that there may not be size differences between the fins of a p-FET device and the fins of an n-FET device. In some embodiments, the SiGe layer 130 may not need to be removed from the graded SiGe fins 132 in order to keep the width of the graded SiGe fins 132 substantially similar to the dimensions of the silicon fins 120 (FIG. 1). In all cases, the width (w) of the graded SiGe fins 132 may be reduced to the desired dimension.

Figure 5:
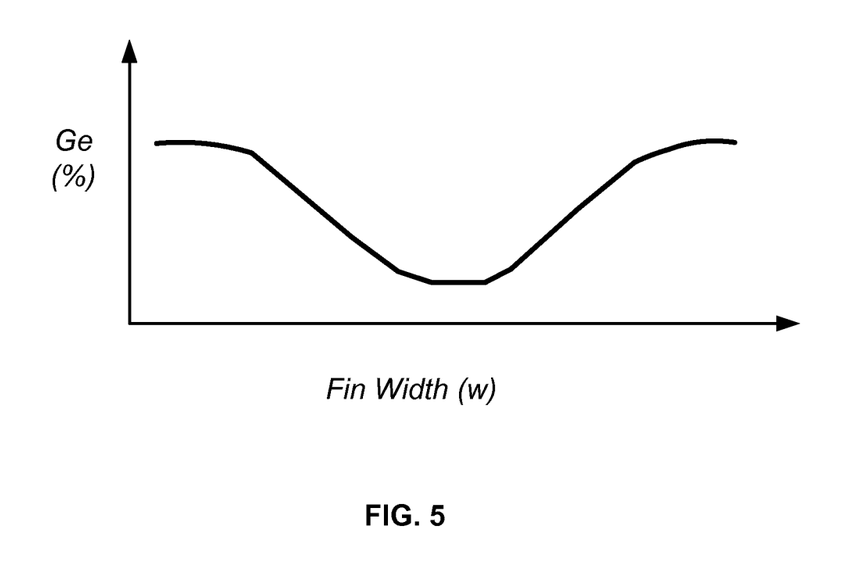
FIG. 5 is a plot depicting a germanium concentration profile in the graded silicon-germanium fins, according to an embodiment of the present disclosure.

Referring now to FIG. 5, the variation of germanium concentration with a width (w) of the graded SiGe fins 132 (shown in FIG. 4) is illustrated. The graded SiGe fins 132 may exhibit a graded germanium concentration profile consisting of several sub-layers with varying concentration of germanium atoms that may increase towards the outer edges of the graded fins 132 and decrease towards the center of the graded SiGe fins 132. This distribution of germanium atoms within the graded fins 132 may cause holes to be as near as possible to the subsequently formed gate structure improving short channel effect control.

An alternate way to fabricate a graded SiGe channel may include growing the SiGe layer 130 on a substantially thinner fin. Another embodiment by which to fabricate a graded SiGe channel is described in detail below by referring to the accompanying drawings in FIGS. 6-7.

Figure 6:
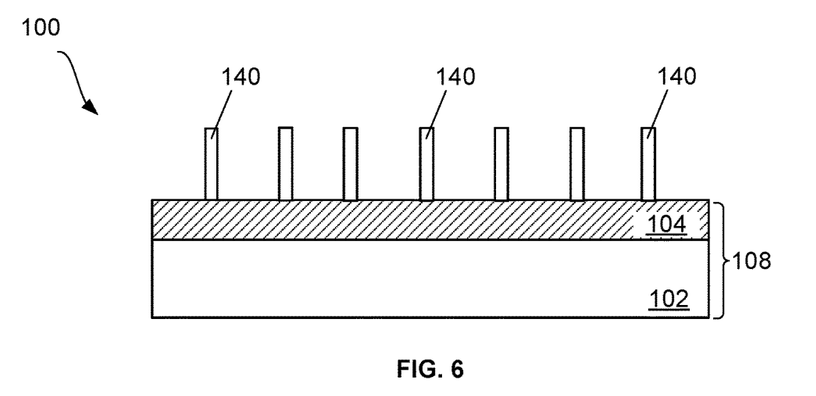
FIG. 6 is a cross-sectional view of a semiconductor structure depicting etching of silicon fins, according to an embodiment of the present disclosure.
Figure 7:
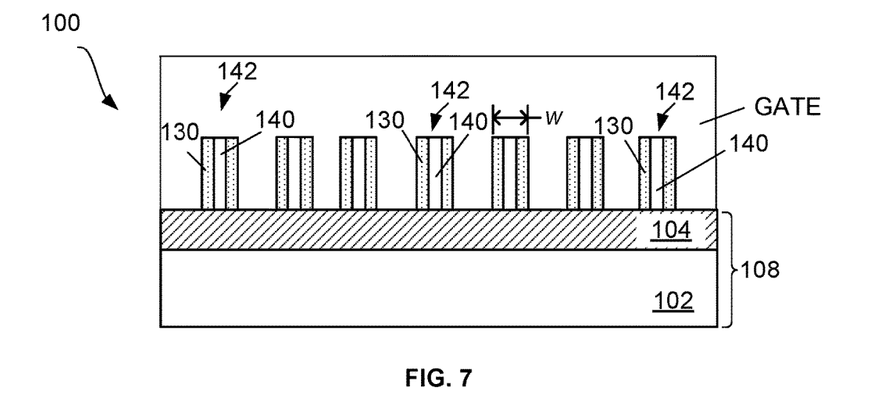
FIG. 7 is a cross-sectional view of a semiconductor structure depicting an alternate method of forming graded silicon-germanium fins, according to an embodiment of the present disclosure.

Referring now to FIG. 6, an alternate embodiment of the present disclosure is shown. In this embodiment, the width of the silicon fins 120 (shown in FIG. 1) may be reduced by means of any etching technique known in the art to form thinned silicon fins 140 prior to the deposition of a SiGe layer 130 (FIG. 7). In one embodiment, for example, the width of the silicon fins 120 (FIG. 1) may be reduced from approximately 10 nm to approximately 4 nm by means of an in-situ hydrochloric acid (HCl) etch technique.

Referring now to FIG. 7, a SiGe layer 130 may be epitaxially grown on sidewalls of the thinned silicon fins 140 to form graded SiGe fins 142. In one embodiment, the SiGe layer 130 may include an epitaxial silicon-germanium material grown with a layered concentration of Ge atoms or an epitaxial silicon-germanium material with a continuously increasing concentration of Ge. The process of forming the SiGe layer 130 on sidewalls of the thinned silicon fins 140 may follow the steps described above in FIG. 2. The layered or graded germanium concentration may be achieved by varying the amount of germanium atoms in the source gas described in FIG. 2. The reduction of the silicon fins 120 and the formation of the SiGe layer 130 on sidewalls of the thinned silicon fins 140 may be conducted taking into account the final width (w) of the graded SiGe fins 142. In one embodiment, the width of the graded SiGe fins 142 may be kept approximately in the 10 nm range. As discussed above, the dimensions of the graded SiGe fins 142 may be substantially similar to the dimensions of the silicon fins 120 shown in FIG. 1 so that there are no size differences between fins of p-FET and n-FET devices.

The steps described in FIGS. 6-7 represent an alternative method of forming graded SiGe fins to the one described in FIGS. 1-5. Both methods may provide graded SiGe fins with higher germanium concentration towards outer edges of the graded SiGe fins (as shown in FIG. 5) defining a high hole mobility region in the vicinity of a subsequently formed gate structure. This translates into a p-FET device having a graded SiGe channel region in which the concentration of germanium atoms may increase perpendicular to the current flow. The higher concentration of germanium atoms near the subsequently formed gate structure may prevent current leakage and improve device performance.

Referring now to FIGS. 8-14, a sequence of processing steps for fabricating a SiGe channel in an alternate exemplary embodiment of the present disclosure is presented. More specifically, the alternate exemplary embodiment will focus on the fabrication of a p-type extremely thin semiconductor-on-insulator (ETSOI) field-effect transistor (FET) device. However, the sequence of processing steps may be equally appropriate for p-type FinFET devices.

One way to fabricate a graded SiGe channel may include diffusing germanium atoms into a Si channel region from a SiGe layer. One embodiment by which to fabricate a graded SiGe channel is described in detail below by referring to the accompanying drawings in FIGS. 8-12.

Figure 8:
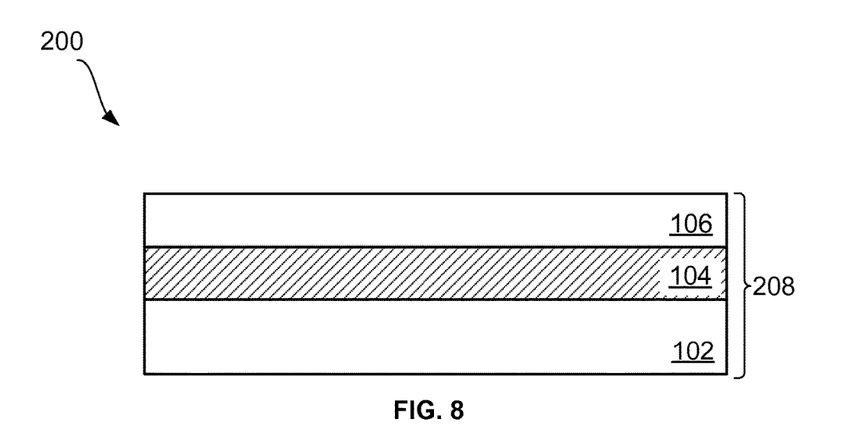
FIG. 8 is a cross-sectional view of a semiconductor structure depicting an ETSOI substrate, according to an embodiment of the present disclosure.

Referring now to FIG. 8, a semiconductor structure 200 including an extremely thin semiconductor-on-insulator (ETSOI) substrate 208 is shown. Similarly to the SOI substrate 108 described above, the ETSOI substrate 208 may include a base substrate 102, a buried dielectric layer 104 formed on top of the base substrate 102, and a SOI layer 106 formed on top of the buried dielectric layer 104. In one embodiment, the SOI layer 106 may include an extremely thin semiconductor-on-insulator (ETSOI) layer. The ETSOI layer 106 may have a thickness ranging from about 3 nm to about 20 nm. In one embodiment, the thickness of the ETSOI layer 106 may range from about 4 nm to about 10 nm. The overall fabrication of the ETSOI substrate 208 may be analogous to the fabrication of the SOI substrate 108 described above in FIG. 1.

Figure 9:
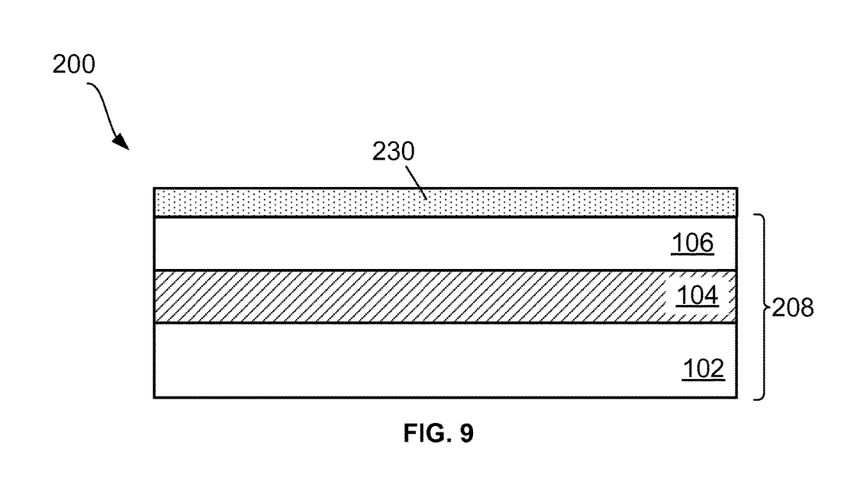
FIG. 9 is a cross-sectional view of a semiconductor structure depicting the formation of a silicon-germanium layer on an ETSOI layer of the ETSOI substrate, according to an embodiment of the present disclosure.

Referring now to FIG. 9, a SiGe layer 230 may be formed above the ETSOI layer 106. The SiGe layer 230 may be formed utilizing any epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it is formed. For example, an epitaxial semiconductor material deposited on a {100} crystal surface will take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Examples of various epitaxial growth process apparatuses that are suitable for use in forming the SiGe layer 230 may include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the SiGe layer 230 typically ranges from about 550° C. to about 900° C. Although higher temperature typically results in faster deposition, the faster deposition may result in crystal defects and film cracking.

A number of different source gases may be used for the deposition of the SiGe layer 230. In one embodiment, a combination of a silicon source gas and a germanium source gas may be used in forming the layer of silicon germanium alloy. Examples of silicon source gases that may be used include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium source gases that may be used include germane, digermane, halogermane, dichlorogermane, trichlorogermane, tetrachlorogermane and combinations thereof. In some embodiments, a single source gas that includes a silicon component and a germanium component may be used in forming the SiGe layer 230. Carrier gases like hydrogen, nitrogen, helium and argon may be used during the epitaxial growth process.

In one embodiment of the present disclosure, the SiGe layer 230 may have an elevated concentration of germanium atoms. The atomic concentration of Ge in the SiGe layer 230 may range from about 30% to about 80%. In another embodiment, the concentration of Ge may range from about 40% to about 60%. The SiGe layer 230 may have a uniform thickness ranging from about 5 nm to about 20 nm and ranges there between, although a thickness less than 5 nm and greater than 20 nm may be acceptable. In one particular embodiment, the SiGe layer 230 may have a thickness of approximately 6 nm.

Figure 10:
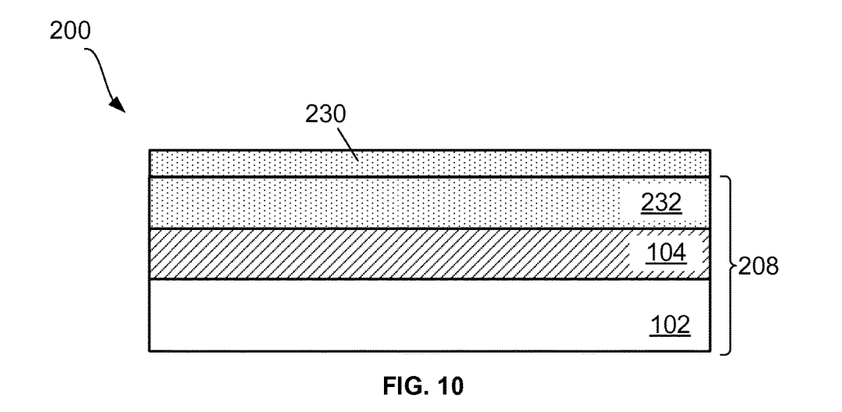
FIG. 10 is a cross-sectional view of a semiconductor structure depicting the formation of a graded silicon-germanium ETSOI layer, according to an embodiment of the present disclosure.

Referring now to FIG. 10, the semiconductor structure 200 may be subjected to a thermal annealing treatment to cause the diffusion of germanium atoms from the SiGe layer 230 into the ETSOI layer 106 (FIG. 9). The thermal diffusion process may be performed at a temperature high enough to cause diffusion of germanium atoms out of the SiGe layer 230 and into the ETSOI layer 106 (FIG. 9). The thermal diffusion of germanium atoms may take place under controlled conditions of temperature and time in order to avoid homogenization of germanium atoms in the ETSOI layer 106 (FIG. 9). In one embodiment, for example, the thermal diffusion process may be performed at a temperature varying from about 800° C. to about 1150° C., for about 1 min to about 30 min. The thermal difffusion process may be carried out at a single targeted temperature, or various ramp and soak cycles using various ramp rates and soak times may be employed.

The higher concentration of germanium in the SiGe layer 230 may enable a rapid diffusion of germanium atoms into the ETSOI layer 106 (FIG. 9) during the thermal treatment, favoring the subsequent formation of a high gradient SiGe ETSOI layer 232 (hereinafter "graded ETSOI layer"). The overall thickness of the SiGe layer 230 and its corresponding germanium concentration together with the duration and temperature of the thermal treatment may determine the amount of germanium atoms diffusing into the ETSOI layer 106 (FIG. 9) to form the graded ETSOI layer 232.

In one embodiment, the atomic concentration of germanium in the graded ETSOI layer 232 after the thermal diffusion may range from about 25% to about 45%. At this step of the fabrication process, the atomic concentration of germanium in the SiGe layer 230 may have decreased after the thermal diffusion process, however it may still be high enough to allow for the selective removal of the SiGe layer 230 with respect to the graded ETSOI layer 232.

Figure 11:
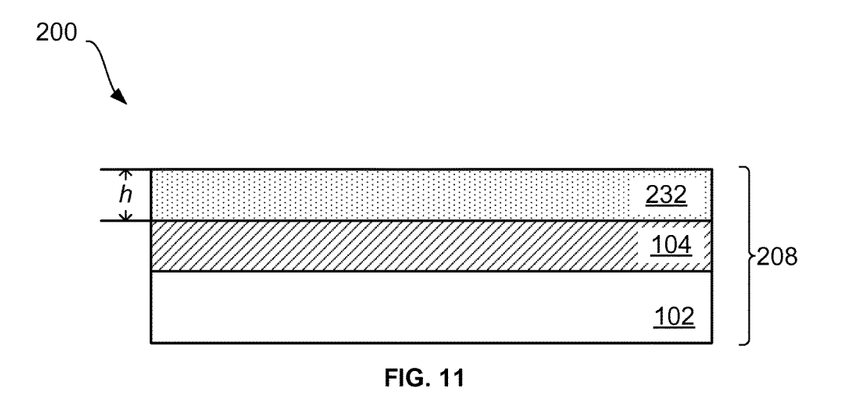
FIG. 11 is a cross-sectional view of a semiconductor structure depicting the removal of the silicon-germanium layer from the graded silicon-germanium ETSOI layer, according to an embodiment of the present disclosure.

Referring now to FIG. 11, the SiGe layer 230 may be removed from above the graded ETSOI layer 232 in order to keep the dimensions of the graded ETSOI layer 232 similar to the initial dimensions of the ETSOI layer 106 described in FIG. 8. Owing to the still elevated concentration of germanium atoms within the SiGe layer 230, it may be selectively removed to the graded ETSOI layer 232 by means of any suitable etching technique known in the art, such as for example: gaseous HCl etch or wet etch with tetramethylammonium hydroxide (TMAH). In one embodiment, the HCl gas etch may be conducted in the epitaxial reactor. In one embodiment the deposition of the SiGe layer 230, the thermal treatment, and removal of the SiGe layer 230 may be performed in the same epitaxy reactor without taking the wafer out of the reactor.

The graded ETSOI layer 232 may have substantially similar thickness than the ETSOI layer 106 (FIG. 8) so that there may not be size differences between the ETSOI layer of a p-FET device and the ETSOI layer of an n-FET device. In some embodiments, the SiGe layer 230 may not need to be removed from above the graded ETSOI layer 232 in order to keep the thickness of the graded ETSOI layer 232 substantially similar to the dimensions of the ETSOI layer 106 (FIG. 8). In all cases, a thickness (h) of the graded ETSOI layer 232 may be reduced to the desired dimension.

Figure 12:
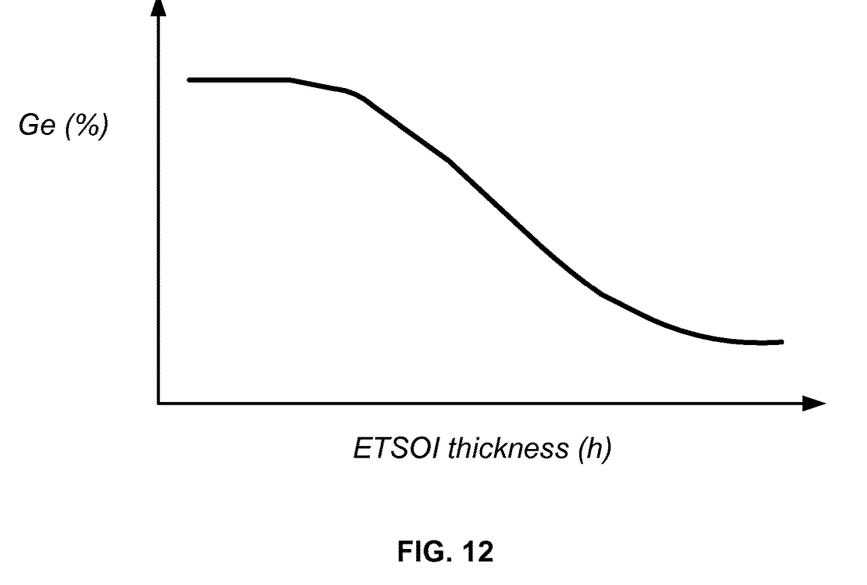
FIG. 12 is a plot depicting a germanium concentration profile in the graded ETSOI layer, according to an embodiment of the present disclosure.

Referring now to FIG. 12, the variation of germanium concentration with the thickness of the graded ETSOI layer 232 is illustrated. The graded ETSOI layer 232 may exhibit a graded germanium concentration profile consisting of several sub-layers with varying concentration of germanium atoms that may increase towards a top portion of the graded ETSOI layer 232 and decrease towards a bottom portion of the graded ETSOI layer 232. This distribution of germanium atoms within the graded ETSOI layer 232 may cause holes to be as near as possible to a subsequently formed gate structure improving short channel effect control.

An alternate way to fabricate a graded SiGe channel in an ETSOI FET device may include growing a SiGe layer 230 on a substantially thinner ETSOI layer. Another embodiment by which to fabricate a graded SiGe channel is described in detail below by referring to the accompanying drawings in FIGS. 13-14.

Figure 13:
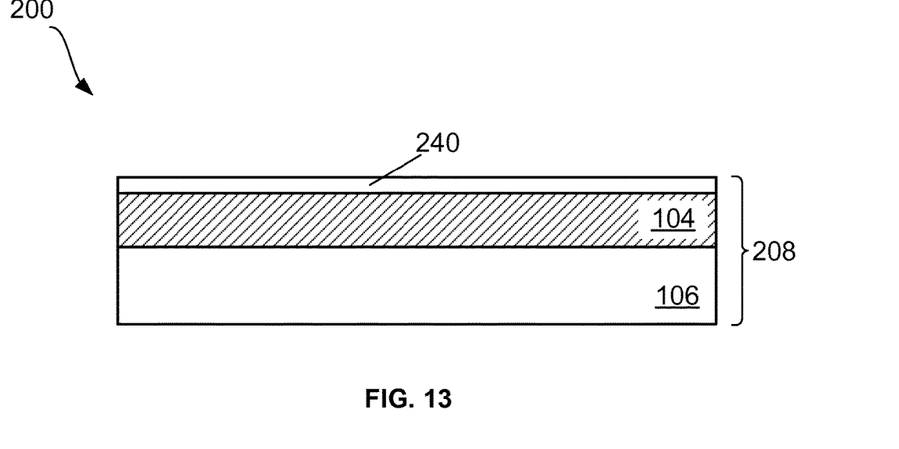
FIG. 13 is a cross-sectional view of a semiconductor structure depicting etching of the ETSOI layer as an alternate method of forming the graded ETSOI layer, according to an embodiment of the present disclosure.

Referring now to FIG. 13, in an alternate embodiment of the present disclosure, the thickness of the ETSOI layer 106 (shown in FIG. 8) may be reduced by means of any etching technique known in the art to form a thinned ETSOI layer 240. In one embodiment, for example, the thickness of the ETSOI layer 106 (FIG. 8) may be reduced from approximately 6 nm to approximately 2 nm by means of an in-situ hydrochloric acid (HCl) etch technique.

Figure 14:
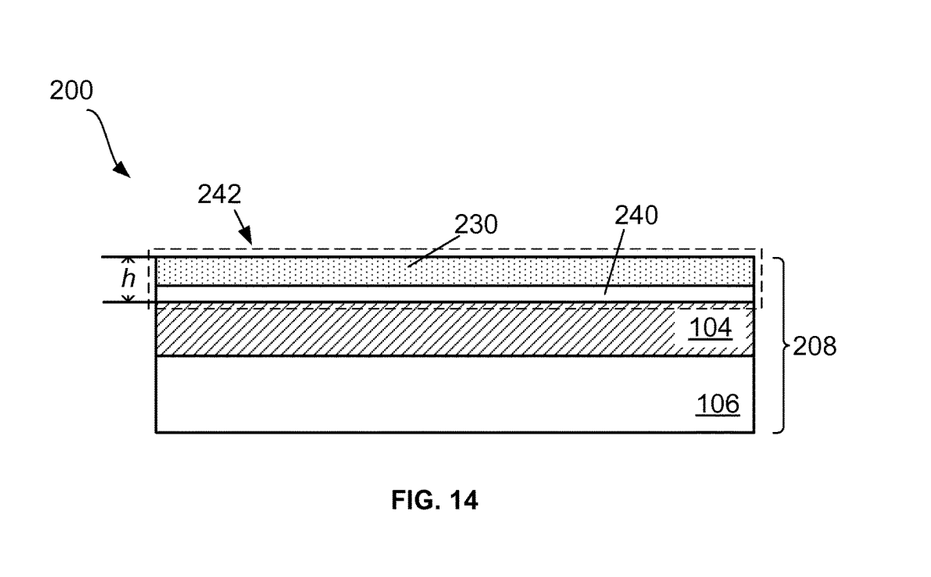
FIG. 14 is a cross-sectional view of a semiconductor structure depicting a graded silicon-germanium ETSOI layer formed by an alternate method, according to an embodiment of the present disclosure.

Referring now to FIG. 14, a SiGe layer 230 may be epitaxially grown on the thinned ETSOI layer 240 to form a graded ETSOI layer 242. In one embodiment, the SiGe layer 230 may include an epitaxial silicon-germanium material grown with a layered concentration of Ge atoms or an epitaxial silicon-germanium material with a continuously increasing concentration of Ge. The process of forming the SiGe layer 230 above the thinned ETSOI layer 240 may follow the steps described above in FIG. 9. The layered or graded germanium concentration may be achieved by varying the amount of germanium atoms in the source gas described in FIG. 9. The reduction of the ETSOI layer 106 (FIG. 8) and the formation of the SiGe layer 230 above the thinned ETSOI layer 240 may be conducted taking into account the final thickness (h) of the graded ETSOI layer 242. In one embodiment, the thickness of the graded ETSOI layer 242 may be kept approximately in the 6 nm range. As discussed above, the thickness of the graded ETSOI layer 242 may be substantially similar to the thickness of the ETSOI layer 106 shown in FIG. 8 so that there are no size differences between ETSOI layer (an hence channel regions) of p-FET and n-FET devices.

The processing steps described in FIGS. 8-14 may provide a method of forming an ETSOI FET having a graded SiGe channel. FIGS. 13-14 represent an alternative method of forming a silicon-germanium ETSOI layer with a graded concentration profile of germanium atoms to the one depicted in FIGS. 8-12. Both methods may provide a graded SiGe channel with higher germanium concentration towards the top portion of the channel region (as shown in FIG. 12) defining a high hole mobility region in the vicinity of a subsequently formed gate structure. This translate into a p-type ETSOI FET device having a graded SiGe channel region in which the highest concentration of germanium atoms may be located in a top portion of the channel region while the lowest concentration of germanium atoms may be located in a bottom portion of the channel region. The high concentration of germanium atoms in the top portion of the channel region, near the subsequently formed gate structure, may prevent current leakage in p-FET devices and as a result improve device performance.

The steps described above may provide a method of forming p-FET devices namely planar ETSOI and FinFET devices having a graded SiGe channel region. In addition to the advantages of having a graded SiGe channel previously mentioned, p-FET devices manufacture following the above processing steps, may also exhibit a SiGe channel region with substantially similar proportions to silicon channel regions of n-FET devices formed within the same semiconductor substrate, which may be crucial to effectively control short-channel effect and improve performance in fully depleted MOSFET devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising a p-FET region and an n-FET region, the semiconductor structure comprising:
a graded silicon-germanium fin in the p-FET region extending upward from a top surface of a buried dielectric layer of a semiconductor substrate, wherein the graded silicon-germanium fin comprises a concentration of germanium atoms across an entire height of the graded silicon-germanium fin, wherein the concentration of germanium atoms is increasing in a direction perpendicular to a height of the graded silicon-germanium fin, such that the concentration of germanium increases towards vertical sidewalls of a gate structure partially surrounding a portion of the graded silicon-germanium fin and the concentration of germanium decreases towards a vertical center of the graded silicon-germanium fin, wherein the concentration of germanium is highest along the vertical sidewalls of the gate structure; and
wherein the graded silicon-germanium fin has substantially similar dimensions as a silicon fin in the n-FET region extending upward from the top surface of the buried dielectric layer of the semiconductor substrate, wherein a width and the height of the graded silicon-germanium fin are substantially similar to a width and a height of the silicon fin, respectively.

2. The semiconductor structure of claim 1, wherein the concentration of germanium atoms gradually increasing towards the sidewalls of the graded silicon-germanium fin comprises an atomic concentration of approximately 25% to 45% of germanium.

3. A semiconductor structure comprising:
a silicon fin above and in direct contact with a buried dielectric layer of a semiconductor substrate, the silicon fin located in an n-FET region; and
a silicon-germanium fin above and in direct contact with the buried dielectric layer, the silicon-germanium fin located in a p-FET region, a concentration of germanium across an entire height of the silicon-germanium fin increases in a direction perpendicular to the height of the silicon-germanium fin, such that the concentration of germanium increases towards vertical sidewalls of the silicon-germanium fin, wherein the concentration of germanium is highest along the vertical sidewalls of the silicon-germanium fin,
wherein a width and a height of the silicon fin are substantially similar to a width and the height, respectively, of the silicon-germanium fin.

4. The semiconductor structure of claim 3, wherein the concentration of germanium atoms increasing towards the vertical sidewalls of the silicon-germanium fin comprises an atomic concentration of approximately 25% to 45% of germanium.

5. A semiconductor structure, comprising:
a silicon fin above and in direct contact with a buried dielectric layer of a semiconductor substrate, the silicon fin located in an n-FET region; and a silicon-germanium fin above and in direct contact with the buried dielectric layer, the silicon-germanium fin located in a p-FET region, the germanium concentration across an entire height of the silicon-germanium fin varies across its width such that the germanium concentration decreases according to a gradient profile from each sidewall to its center, and the gradient profile is symmetric about a vertical center line of the silicon-germanium fin, wherein the germanium concentration along an uppermost surface of the silicon-germanium fin varies from each sidewall to its center in accordance with the gradient profile, wherein the concentration of germanium is highest along the sidewalls of the silicon-germanium fin.

6. The semiconductor structure of claim 5, wherein the concentration of germanium atoms increasing towards the sidewalls of the silicon-germanium fin comprises an atomic concentration of approximately 25% to 45% of germanium.

7. The semiconductor structure of claim 5, wherein a width of the silicon-germanium fin is substantially similar to a width of the silicon fin.

\* \* \* \* \*